(12) United States Patent
Huang et al.

(10) Patent No.: US 11,291,134 B2
(45) Date of Patent: Mar. 29, 2022

(54) PROTECTION DEVICE AND PROTECTION CASING

(71) Applicant: Wistron Corporation, New Taipei (TW)

(72) Inventors: Wen Huang, New Taipei (TW);
Qin-Ming Wu, New Taipei (TW);
Zhi-Tao Yu, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 16/531,950

(22) Filed: Aug. 5, 2019

(65) Prior Publication Data

US 2020/0296855 A1 Sep. 17, 2020

(30) Foreign Application Priority Data

Mar. 14, 2019 (CN) .................... 201910193267.X

(51) Int. Cl.
*H05K 7/00* (2006.01)
*H05K 7/14* (2006.01)
*G06F 1/18* (2006.01)
*H05K 7/18* (2006.01)

(52) U.S. Cl.
CPC ........... *H05K 7/1488* (2013.01); *G06F 1/181* (2013.01); *H05K 7/18* (2013.01)

(58) Field of Classification Search
None
See application file for complete search history.

(56) References Cited

U.S. PATENT DOCUMENTS

| 5,721,669 | A | * | 2/1998 | Becker | G11B 33/124 361/679.31 |
| 9,001,514 | B2 | * | 4/2015 | Rust | G11B 33/128 361/727 |
| 9,098,233 | B2 | * | 8/2015 | Keffeler | H05K 5/0217 |
| 9,456,515 | B2 | * | 9/2016 | Pecone | G06F 1/187 |
| 9,763,350 | B2 | * | 9/2017 | Rust | H05K 7/14 |
| 9,817,450 | B2 | * | 11/2017 | Zani | H02J 9/00 |
| 10,317,957 | B2 | * | 6/2019 | Adrian | G06F 1/187 |
| 2005/0068745 | A1 | * | 3/2005 | Hartman | H05K 7/1421 361/726 |

(Continued)

FOREIGN PATENT DOCUMENTS

| CN | 202042400 U | 11/2011 |
| TW | 1492692 B | 7/2015 |

OTHER PUBLICATIONS

Office Action dated Apr. 30, 2020 in corresponding Taiwan Patent Application No. 108112980.

(Continued)

*Primary Examiner* — Anthony Q Edwards
*Assistant Examiner* — Rashen E Morrison
(74) *Attorney, Agent, or Firm* — Donald E. Stout; Stout, Uxa & Buyan, LLP

(57) ABSTRACT

A protection device, disposed on a base or an accommodating rack that is disposed on the base, includes a bracket slidingly disposed on the base and being slidable between a first position and a second position, and a switch disposed in the bracket. At least a portion of the switch is in the accommodating rack when the bracket is in the first position; and the switch is out of the accommodating rack when the bracket is in the second position.

20 Claims, 9 Drawing Sheets

(56) References Cited

U.S. PATENT DOCUMENTS

| | | | |
|---|---|---|---|
| 2009/0153002 A1* | 6/2009 | Kinoshita | B60R 11/0258 312/223.1 |
| 2010/0172087 A1* | 7/2010 | Jeffery | G11B 33/02 361/679.33 |
| 2014/0340838 A1* | 11/2014 | Deng | H05K 5/0217 361/679.33 |

OTHER PUBLICATIONS

Office Action dated Jul. 19, 2021 in corresponding Chinese Patent Application No. 201910193267.X.

* cited by examiner

PROTECTION DEVICE AND PROTECTION CASING

CROSS-REFERENCE TO RELATED APPLICATIONS

This application claims priority of China Patent Application No. 201910193267.X, filed on Mar. 14, 2019, the entire contents of which are hereby incorporated by reference.

BACKGROUND OF THE INVENTION

1. Field of the Invention

The present invention generally relates to a protection device, and more particularly to a retractable protection device.

2. Description of Related Art

When a computer device such as a server is during maintenance, a cover should be removed before performing maintenance inside the computer device. Electric shock will incur if an operator forgets to disconnect power before removing the cover. Accordingly, an intrusion switch is commonly adopted in the computer device, and is fastened at the top of the computer device via a bracket and screws. Specifically, the intrusion switch is pushed when the cover is put, thereby electrically connecting the power; and the intrusion switch is released when the cover is removed, thereby electrically disconnecting the power and preventing electric shock.

However, the bracket utilized to fasten the intrusion switch may commonly block the operator from performing element loading and unloading operation perpendicular to a circuit board. In that regard, the operator should usually remove the bracket utilized to fasten the intrusion switch before maintenance, and should fix the bracket utilized to fasten the intrusion switch after maintenance. Therefore, work efficiency of maintenance is substantially reduced.

A need has thus arisen to propose a novel protection scheme for overcoming disadvantages of conventional protection devices.

SUMMARY OF THE INVENTION

In view of the foregoing, it is an object of the embodiment of the present invention to provide a retractable protection device, which may be hid in an accommodating rack such that an operator may perform element loading and unloading operation perpendicular to a circuit board.

According to one embodiment, a protection casing includes a base, a bracket, a switch, an accommodating rack and a cover. The bracket is slidingly disposed on the base or the accommodating rack and is slidable between a first position and a second position. The switch is disposed in the bracket. The accommodating rack is disposed on the base. The cover activates the switch when the cover connects the base. At least a portion of the switch is in the accommodating rack when the bracket is in the first position; and the switch is out of the accommodating rack when the bracket is in the second position.

DETAILED DESCRIPTION OF THE INVENTION

Figure 1:
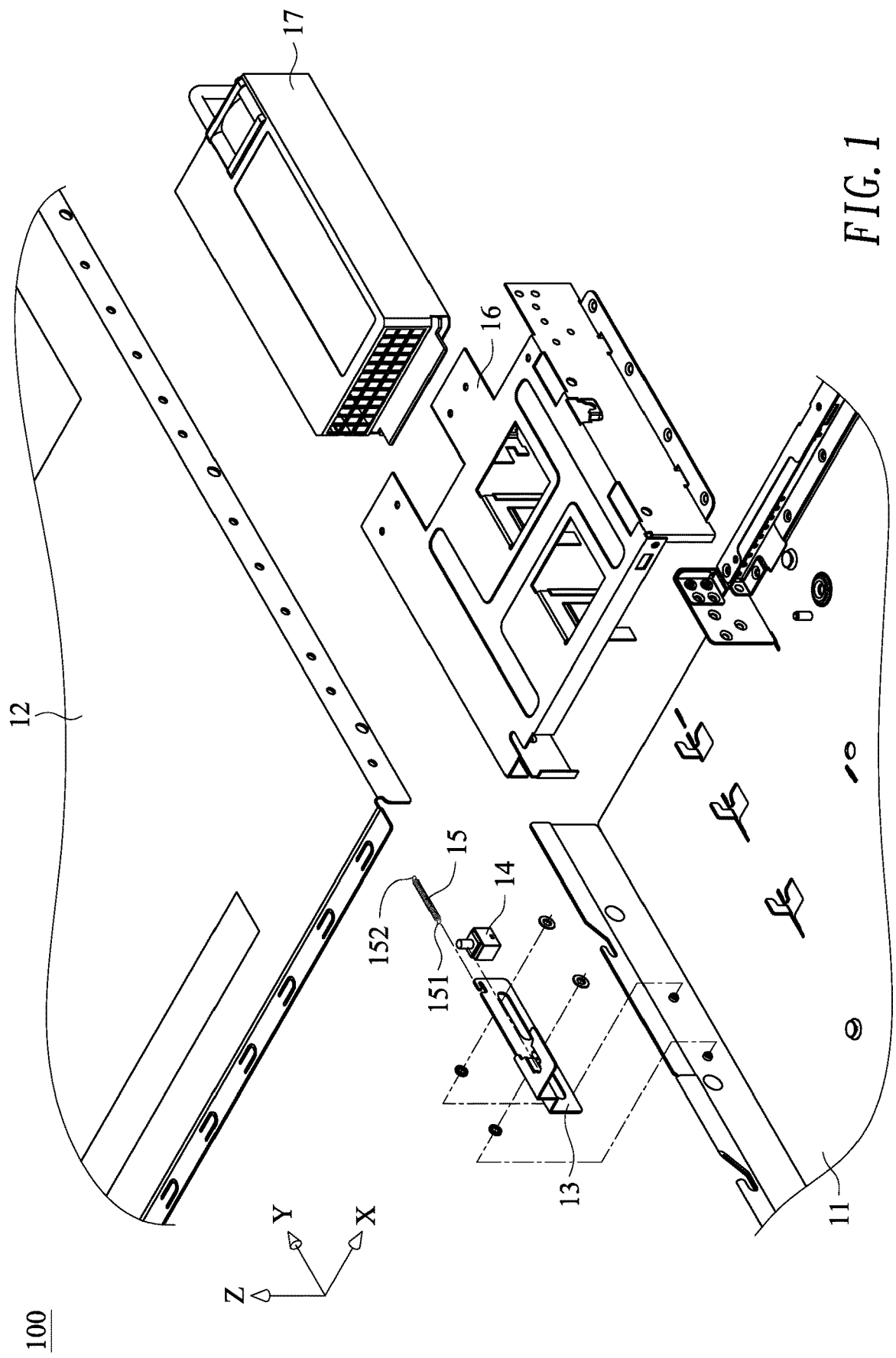
FIG. 1 shows an exploded view illustrating a retractable protection casing according to one embodiment of the present invention.

FIG. 1 shows an exploded view illustrating a retractable protection casing 100, adaptable to an electronic device such as a server, according to one embodiment of the present invention. In the embodiment, the retractable protection casing (protection casing hereinafter) 100 may primarily include a base 11, a cover 12, a bracket 13, a switch (such as a push-button switch) 14, an elastic member 15, an accommodating rack 16 and a component 17. The bracket 13, the switch 14 and the elastic member 15 constructs a protection device of the embodiment.

Figure 2:
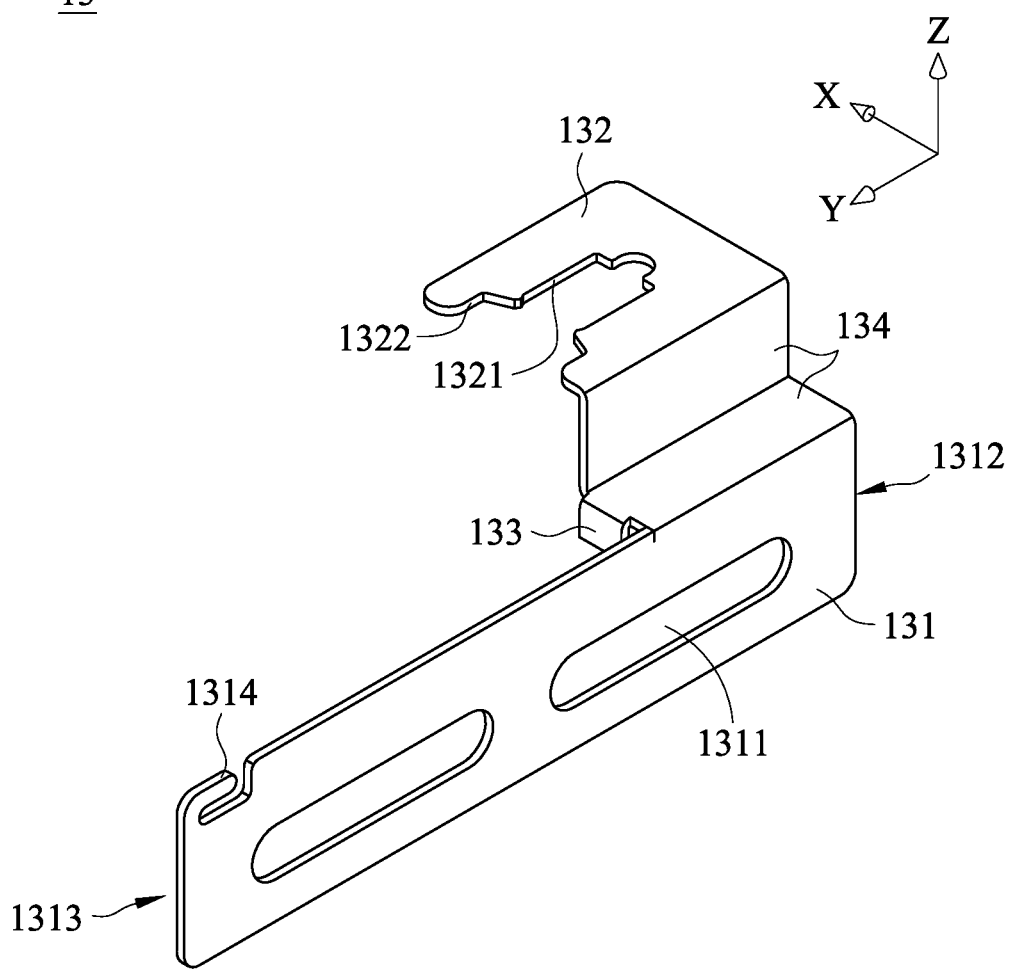
FIG. 2 shows a perspective view illustrating the bracket of FIG. 1.

FIG. 2 shows a perspective view illustrating the bracket 13 of FIG. 1. In the embodiment, the bracket 13 may include a sliding member 131, having a slide guiding groove 1311, which may slide along a sliding axis (e.g., Y axis as shown). The sliding member 131 may have a first end 1312 and a second end 1313. The second end 1313 may have a hook-like first connecting part 1314 configured to connect a first end 151 of the elastic member 15 (e.g., a spring).

The bracket 13 may include a connecting member 132 disposed at the first end 1312 of the sliding member 131. Specifically, the connecting member 132 may extend from a side of the sliding member 131 and be perpendicular to the sliding member 131. The connecting member 132 may be configured to connect and fasten the switch 14. Specifically, the connecting member 132 may have a connecting part 1321 disposed in a center of the connecting member 132 and having a profile of the switch 14 for connecting the switch 14. The connecting member 132 may have a guiding part 1322 disposed at one side (facing the second end 1313 of the sliding member 131) of the connecting member 132 and joining the connecting part 1321 for guiding the switch 14 into the connecting part 1321. The bracket 13 may include a stopping part 133, being perpendicular to the sliding member 131 and the connecting member 132, for facilitating pushing the bracket 13 by the component 17. In the embodiment, the bracket may include a transition extending member 134 disposed between the sliding member 131 and the connecting member 132 for increasing space between the sliding member 131 and the connecting member 132.

Figure 3A:
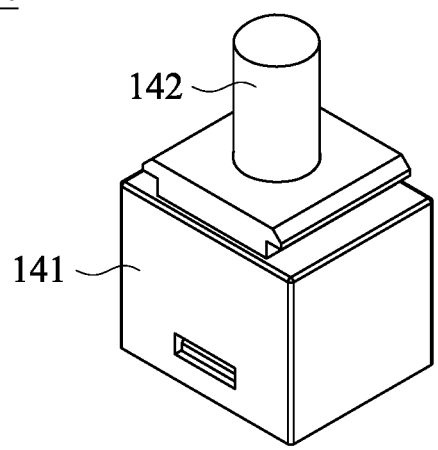
FIG. 3A and FIG. 3B show perspective views illustrating the switch of FIG. 1.
Figure 3B:
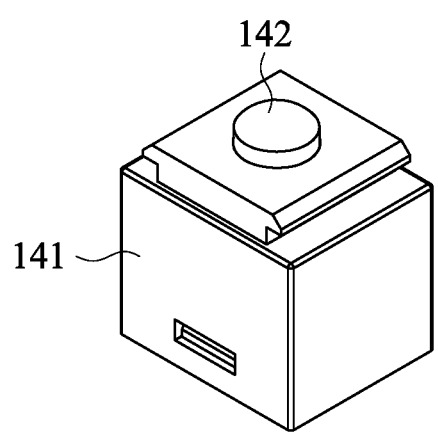

FIG. 3A and FIG. 3B show perspective views illustrating the switch 14 of FIG. 1. The switch 14 may primarily include a basis 141 and a push-button 142 carried by the basis 141. In the embodiment, the switch 14 may be a normally open switch, which becomes closed when the push-button 142 is pushed (as shown in FIG. 3B); and becomes open when the push-button 142 is released (as shown in FIG. 3A). In the embodiment, a surface of the cover 12 may activate (e.g., push) the push-button 142 when the cover 12 connects the base 11, and the closed switch 14 may electrically connect a power. The surface of the cover 12 may deactivate (e.g., release) the push-button 142 when the cover 12 is opened, and the open switch 14 may electrically disconnect the power to prevent electric shock.

Figure 4:
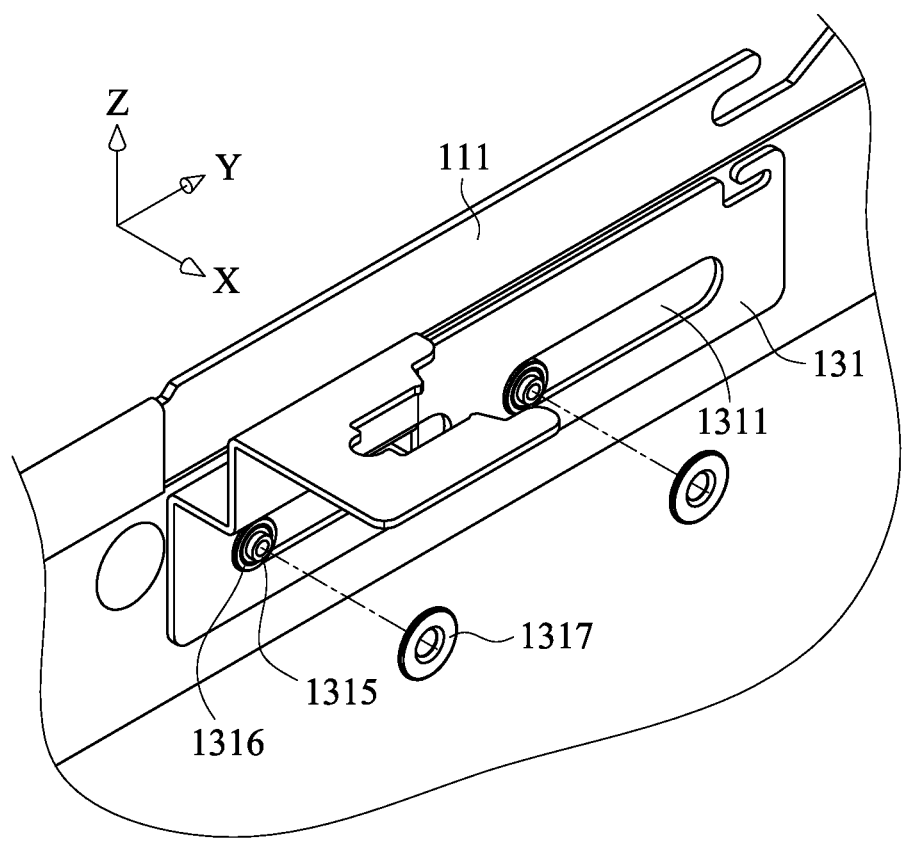
FIG. 4 shows a perspective view illustrating the bracket of FIG. 1 slidingly disposed on a sidewall of the base.

FIG. 4 shows a perspective view illustrating the bracket 13 of FIG. 1 slidingly disposed on a sidewall 111 of the base 11. In the embodiment, a rivet 1315 may pass through the sidewall 111 of the base 11 and the slide guiding groove 1311 of the bracket 13, and a roller cover 1316 may cover the rivet 1315. Accordingly, the bracket 13 may slide with respect to the sidewall 111. In the embodiment, a spacer 1317 may cover the rivet 1315 and the roller cover 1316 to prevent the bracket 13 from moving in a direction perpendicular to the sliding axis. It is appreciated that the bracket 13 may be sliding disposed on a place other than the sidewall 111 of the base 11, for example, on a sidewall or a top surface of the accommodating rack 16.

Figure 5A:
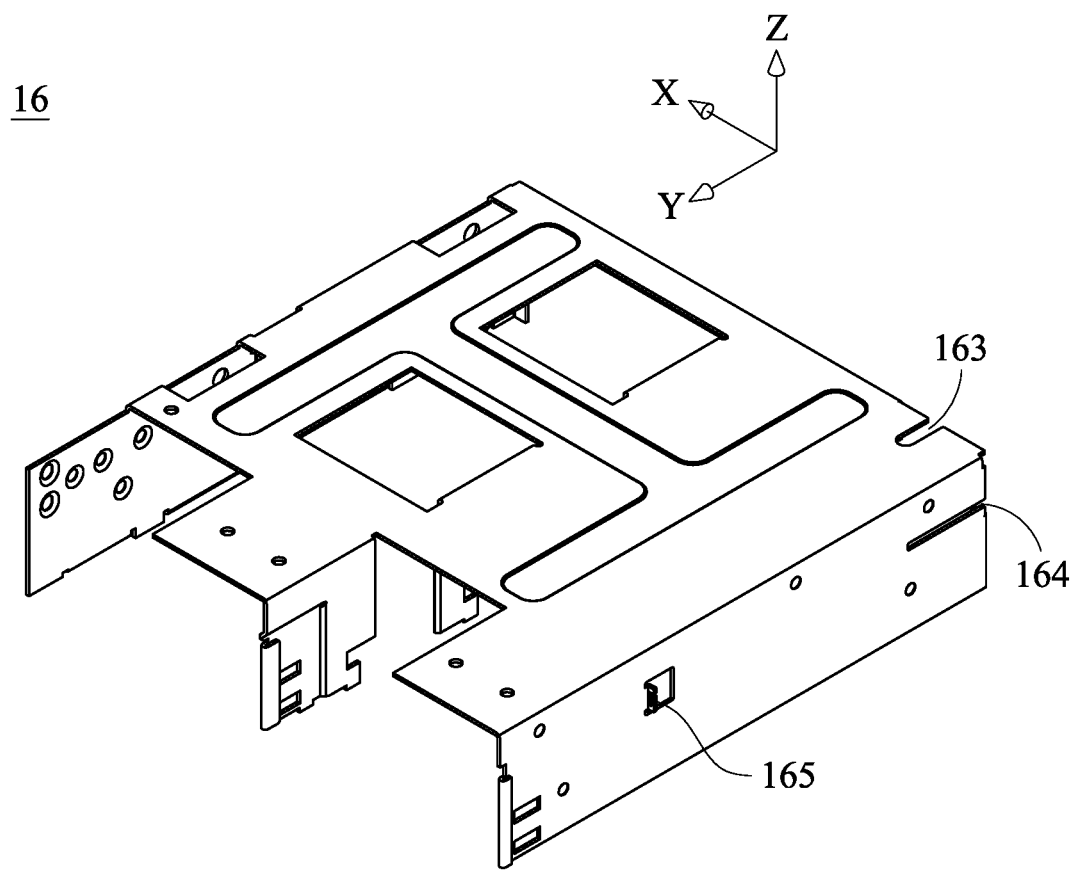
FIG. 5A shows a perspective view illustrating the accommodating rack of FIG. 1.
Figure 5B:
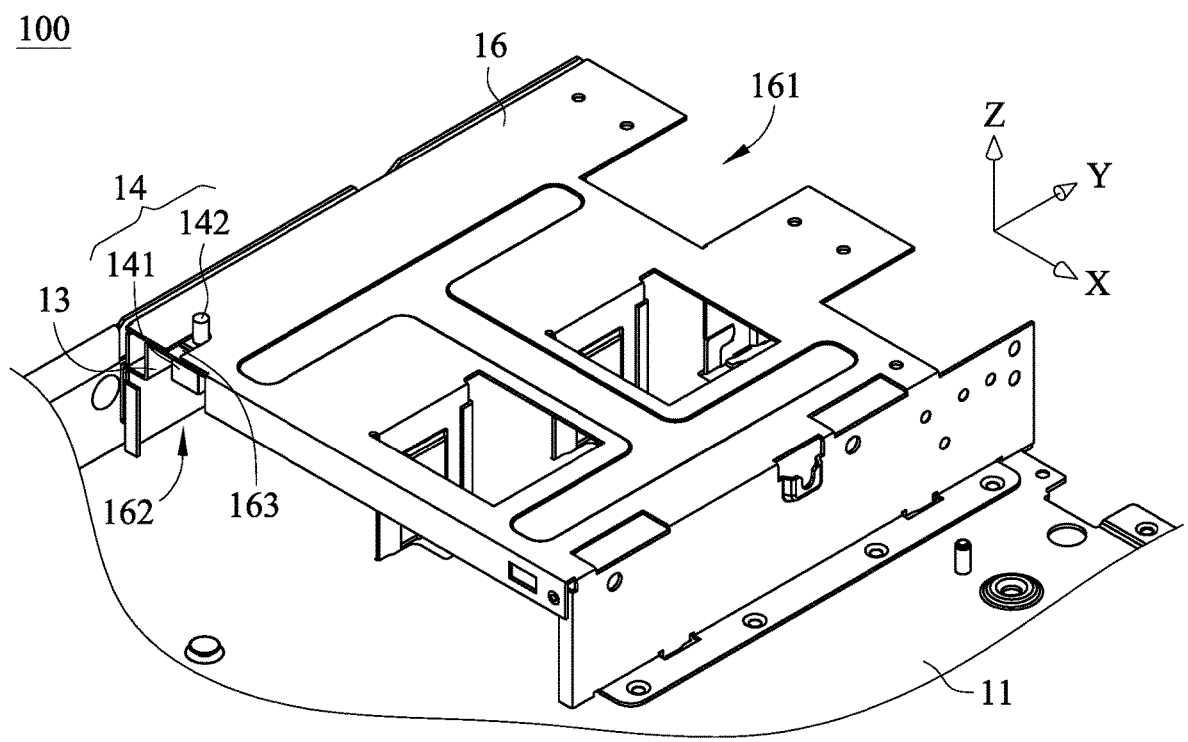
FIG. 5B shows a perspective view illustrating the accommodating rack of FIG. 1 disposed on the base.

FIG. 5A shows a perspective view illustrating the accommodating rack 16 of FIG. 1. FIG. 5B shows a perspective view illustrating the accommodating rack 16 of FIG. 1 disposed on the base 11, and the bracket 13 and the switch 14. The accommodating rack 16 (e.g., a power module rack) of the embodiment may be configured to accommodate the component (e.g., a power module). The accommodating rack 16 may have a first opening 161, through which the component 17 may enter the accommodating rack 16. The accommodating rack 16 may have a second opening 162, through which the bracket 13 may enter the accommodating rack 16. The accommodating rack 16 may have a first collision avoiding groove 163 corresponding to the push-button 142 of the switch 14 for facilitating accommodating the push-button 142 of the switch 14 instead of blocking the push-button 142 of the switch 14, when the switch 14 slides into the accommodating rack 16. The accommodating rack 16 may have a second collision avoiding groove 164 corresponding to the transition extending member 134 of the bracket 13 for facilitating accommodating the transition extending member 134 instead of blocking the bracket 13. As mentioned above, the first end 151 of the elastic member 15 connects the first connecting part 1314 of the sliding member 131. A second end 152 of the elastic member 15 may connect a second connecting part 165 (e.g., disposed on a sidewall) of the accommodating rack 16.

Figure 6A:
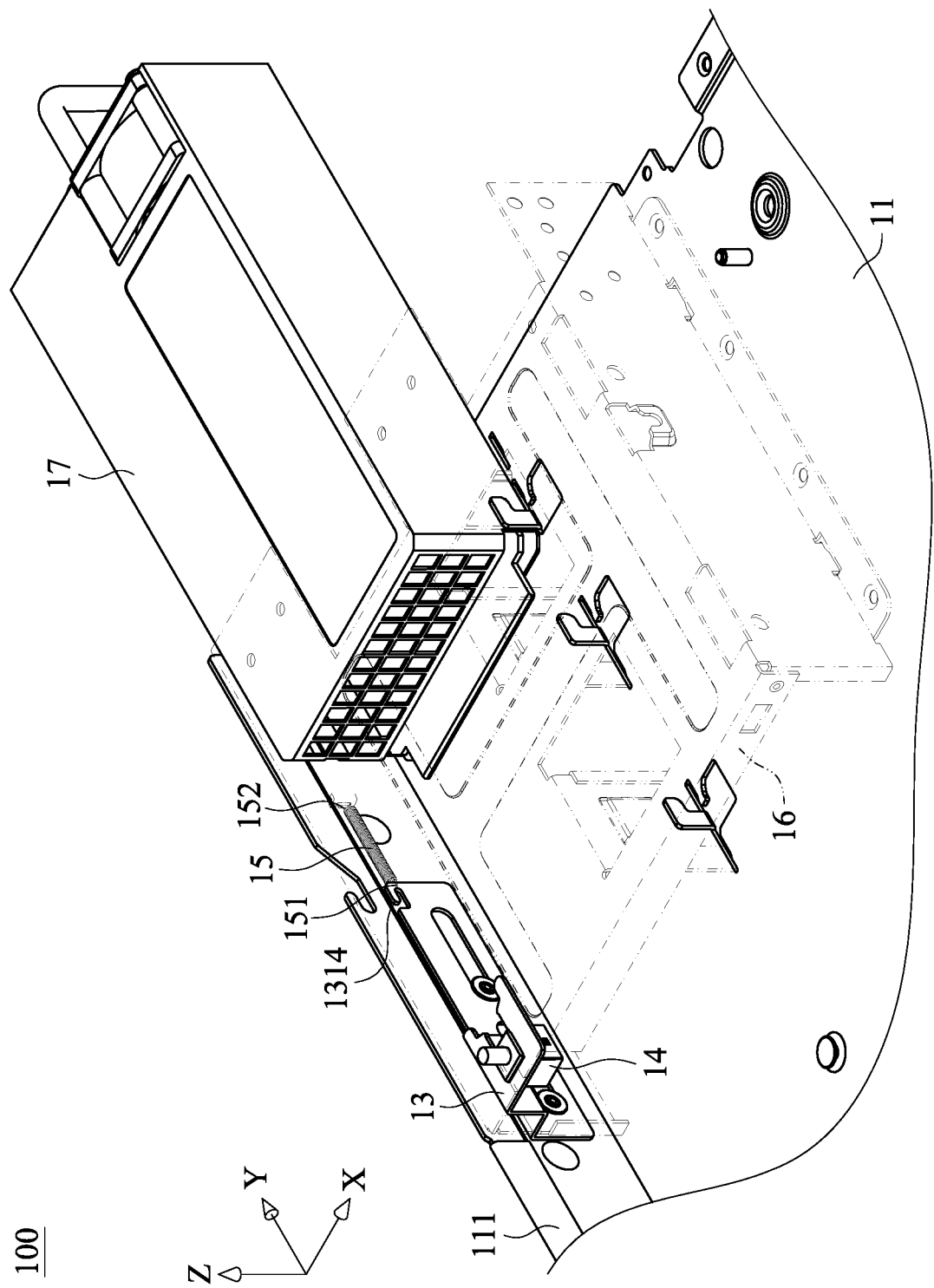
FIG. 6A shows a perspective view illustrating the component of FIG. 1 before entering the accommodating rack.

FIG. 6A shows a perspective view illustrating the component (e.g., a power module) of FIG. 1 before entering the accommodating rack 16. As the elastic member 15 is not stretched and partial components (e.g., the connecting member 132, the stopping part 133 and the transition extending member 134) of the bracket 13 and partial components (e.g., the basis 141) of the switch 14 are in the accommodating rack 16 due to resilience of the elastic member 15, the bracket 13 is in first status and in a first position. As partial components of the bracket 13 and partial components of the switch 14 are hid in the accommodating rack 16, an operator may perform element loading and unloading operation outside the accommodating rack 16 and perpendicular to the base 11. In another embodiment, the protection casing 100 does not include an elastic member 15, and an operator may manually push partial components of the bracket 13 and partial components of the switch 14 into the accommodating rack 16.

Figure 6B:
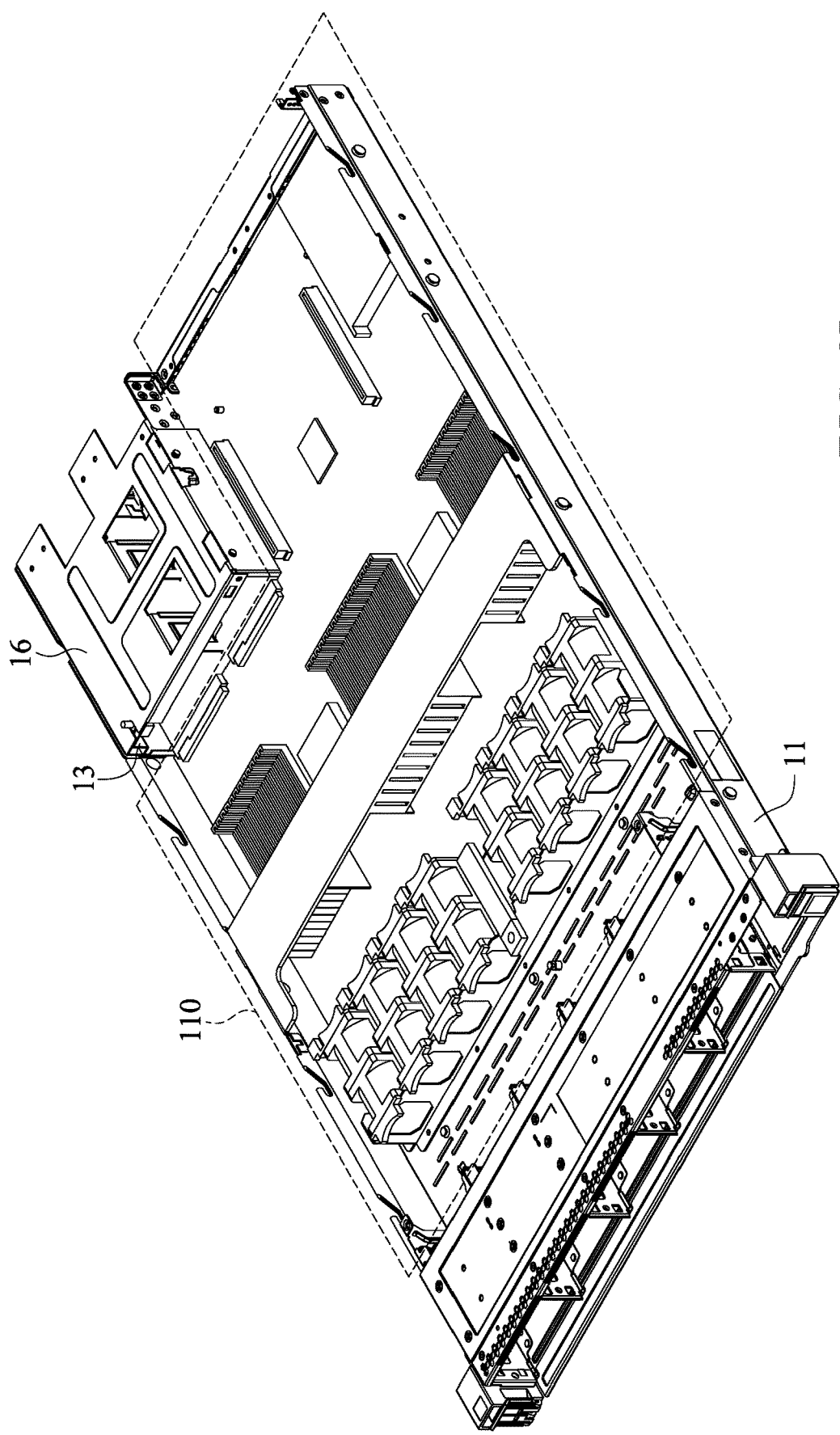
FIG. 6B shows a perspective view exemplifying the base and components disposed thereon.

FIG. 6B shows a perspective view exemplifying the base 11 and components disposed thereon. In one exemplary embodiment, the components disposed on the base 11 may include, among others, central processor units (CPUs), a memory module, computer busses (e.g., Peripheral Component Interconnect or PCI), an expansion card and fans. According to the embodiment, when the bracket 13 is in first status and in the first position, an operator may easily perform element loading and unloading operation on an area (designated by 110) outside the accommodating rack 16 and perpendicular to the base 11.

Figure 6C:
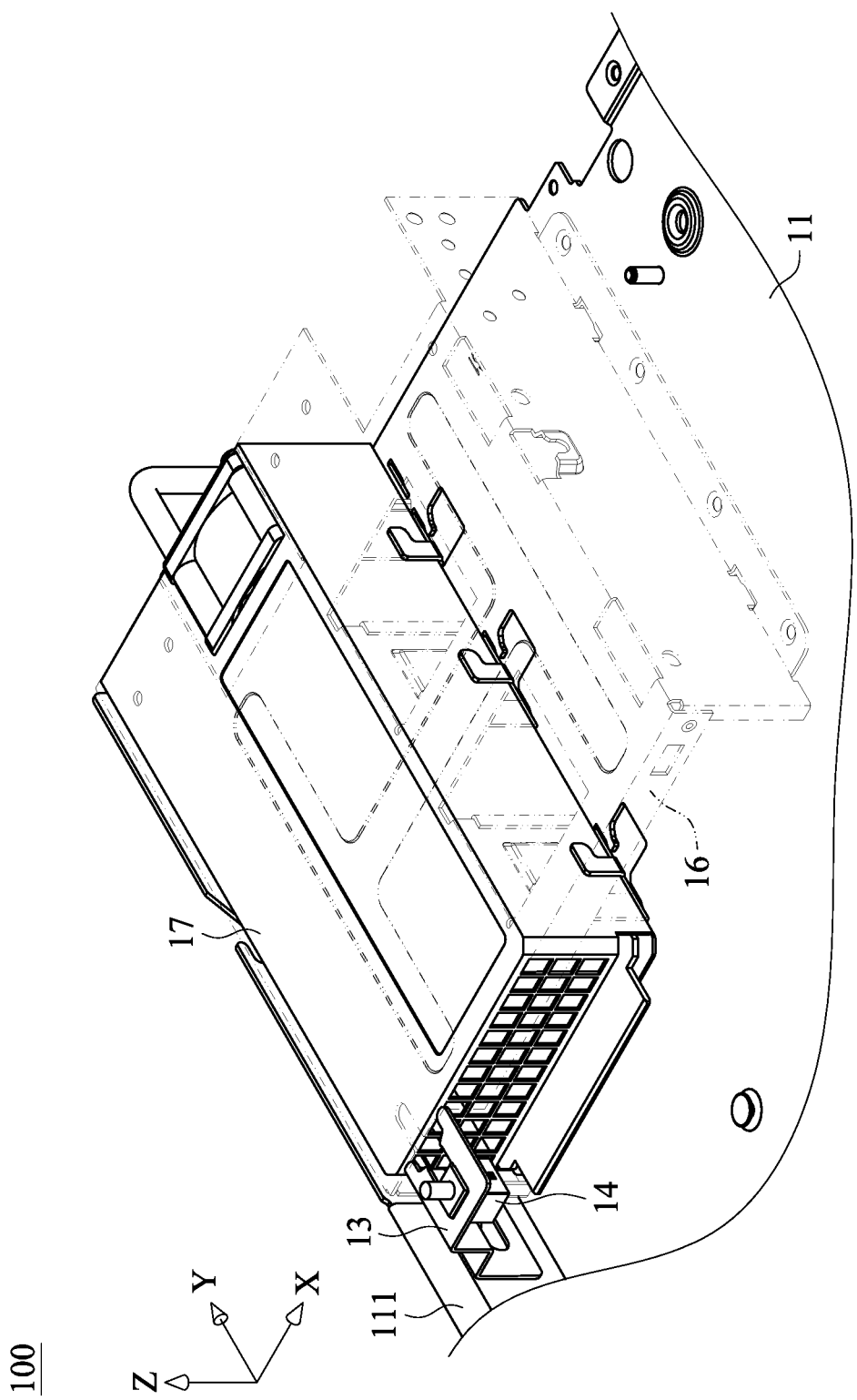
FIG. 6C shows a perspective view illustrating the component of FIG. 1 after entering the accommodating rack.

FIG. 6C shows a perspective view illustrating the component 17 of FIG. 1 after entering the accommodating rack 16. As the component 17 pushes the bracket 13 and the switch 14 out of the accommodating rack 16 via the stopping part 133 (of the bracket 13), the bracket 13 is in second status and in a second position. It is appreciated that the accommodating rack 16 and the component 17 may be adaptable to a component other than the power module, particularly to a component (e.g., a hard disk) that may be loaded and unloaded in a direction parallel with the base 11. In another embodiment, the protection casing 100 does not include an elastic member 15, and an operator may manually push the bracket 13 and the switch 14 out of the accommodating rack 16.

Although specific embodiments have been illustrated and described, it will be appreciated by those skilled in the art that various modifications may be made without departing from the scope of the present invention, which is intended to be limited solely by the appended claims.

What is claimed is:

1. A protection device, disposed on a base, an accommodating rack disposed on the base for accommodating a component, the protection device comprising:
   a bracket, slidingly disposed on the base or the accommodating rack and being slidable between a first position and a second position; and
   a switch, being an electromechanical switch, disposed in and fastened to the bracket;
   wherein at least a portion of the switch is in the accommodating rack when the bracket is in the first position; and the switch is out of the accommodating rack when the component is inside the accommodating rack and the bracket is in the second position.

2. The protection device of claim 1, further comprising:
   an elastic member having an end connecting the bracket.

3. The protection device of claim 2, wherein the bracket comprises:
   a sliding member, having at least one slide guiding groove that slides along a sliding axis, one end of the sliding member having a first connecting part for connecting said end of the elastic member;
   a connecting member, extending from a side of the sliding member and being perpendicular to the sliding member for connecting and fastening the switch; and
   a stopping part, being perpendicular to the sliding member and the connecting member for sliding the sliding member when the stopping part is pushed.

4. The protection device of claim 3, wherein the connecting member comprises a connecting part for connecting the switch.

5. The protection device of claim 4, wherein the connecting member comprises a guiding part disposed at one side of the connecting member and joining the connecting part for guiding the switch into the connecting part.

6. The protection device of claim 3, wherein the bracket further comprises:
   a transition extending member disposed between the sliding member and the connecting member.

7. The protection device of claim 1, wherein the switch is a push-button switch that comprises:

a push-button; and a basis for carrying the push-button;

wherein the push-button switch is a normally open switch, which becomes closed when the push-button is pushed, and becomes open when the push-button is released.

8. A protection casing adaptable to accommodating a component, comprising:

a base;

a bracket being slidable between a first position and a second position;

a switch, being an electromechanical switch, disposed in and fastened to the bracket;

an accommodating rack, disposed on the base, the bracket being slidingly disposed on the base or the accommodating rack; and a cover, which activates the switch when the cover connects the base;

wherein at least a portion of the switch is in the accommodating rack when the bracket is in the first position; and the switch is out of the accommodating rack when the component is inside the accommodating rack and the bracket is in the second position.

9. The protection casing of claim 8, further comprising:

an elastic member having a first end connecting the bracket.

10. The protection casing of claim 9, wherein the elastic member has a second end connecting the accommodating rack or the base.

11. The protection casing of claim 9, wherein the bracket comprises:

a sliding member, having at least one slide guiding groove that slides along a sliding axis, one end of the sliding member having a first connecting part for connecting the first end of the elastic member;

a connecting member, extending from a side of the sliding member and being perpendicular to the sliding member for connecting and fastening the switch; and a stopping part, being perpendicular to the sliding member and the connecting member for sliding the sliding member when the stopping part is pushed.

12. The protection casing of claim 11, wherein the connecting member comprises a connecting part for connecting the switch.

13. The protection casing of claim 12, wherein the connecting member comprises a guiding part disposed at one side of the connecting member and joining the connecting part for guiding the switch into the connecting part.

14. The protection casing of claim 12, wherein the switch comprises a push-button switch.

15. The protection casing of claim 14, wherein the push-button switch comprises:

a push-button; and a basis for carrying the push-button, the connecting part having a profile of the push-button switch for connecting the push-button switch;

wherein the push-button switch is a normally open switch, which becomes closed when the cover activates the push-button, and becomes open when the push-button is released.

16. The protection casing of claim 8, wherein the switch comprises a push-button, and the accommodating rack comprises a first collision avoiding groove for accommodating the push-button of the switch when the bracket is in the first position.

17. The protection casing of claim 11, wherein the bracket further comprises:

a transition extending member disposed between the sliding member and the connecting member.

18. The protection casing of claim 17, wherein the accommodating rack has a second collision avoiding groove for accommodating the transition extending member.

19. The protection casing of claim 11, further comprising:

a rivet, passing through a sidewall of the base and the slide guiding groove of the bracket;

a roller cover, covering the rivet; and a spacer, covering the rivet and the roller cover.

20. The protection casing of claim 8, wherein the accommodating rack is a power module rack, into which a power module enters and pushes the bracket to the second position.

* * * * *